US005372848A

United States Patent [19]

Blackwell et al.

[11] Patent Number: 5,372,848
[45] Date of Patent: Dec. 13, 1994

[54] PROCESS FOR CREATING ORGANIC POLYMERIC SUBSTRATE WITH COPPER

[75] Inventors: Kim J. Blackwell, Owego; Luis J. Matienzo, Endicott; Allan R. Knoll, Endicott, all of N.Y.

[73] Assignee: International Business Machines Corporation, Armonk, N.Y.

[21] Appl. No.: 996,606

[22] Filed: Dec. 24, 1992

[51] Int. Cl.5 .................. C23C 16/00; C23C 14/00; C25D 3/38

[52] U.S. Cl. .................. 427/250; 204/192.14; 204/192.15; 205/182; 205/186

[58] Field of Search .................. 204/192.14, 192.15; 427/250, 124; 205/164, 167, 169, 186, 187, 165

[56] References Cited

U.S. PATENT DOCUMENTS

| | | | |
|---|---|---|---|
| 3,480,922 | 11/1969 | Flur et al. | 340/174 |
| 3,607,384 | 9/1971 | Banks | 117/215 |
| 3,930,975 | 1/1976 | Siegle et al. | 204/192.15 |
| 3,984,907 | 10/1976 | Vossen, Jr. et al. | 204/192.15 |
| 4,098,956 | 7/1978 | Blickensderfer et al. | 428/627 |
| 4,309,261 | 1/1982 | Harding et al. | 204/192 |
| 4,386,116 | 5/1983 | Nair et al. | 427/99 |
| 4,513,905 | 4/1985 | Nowicki et al. | 228/123 |
| 4,816,124 | 3/1989 | Manabe et al. | 204/192 |
| 4,826,720 | 5/1989 | Wade | 428/209 |
| 4,863,808 | 9/1989 | Sallo | 204/192.14 |
| 4,886,681 | 12/1989 | Clabes et al. | 204/192.14 |
| 5,104,734 | 4/1992 | Anschel | 428/336 |

OTHER PUBLICATIONS

Selection Guide-Sputtering Equipment, Microelectronic Manufacturing and Testing (An MMT Staff Report), Nov. 1987, pp. 18-22.

*Primary Examiner*—R. Bruce Breneman
*Assistant Examiner*—Rodney McDonald
*Attorney, Agent, or Firm*—Pollock, VandeSande & Priddy

[57] ABSTRACT

A copper layer is coated onto an organic polymeric substrate in the presence of a gas containing nitrogen and a noble gas.

21 Claims, No Drawings

PROCESS FOR CREATING ORGANIC POLYMERIC SUBSTRATE WITH COPPER

TECHNICAL FIELD

The present invention is concerned with coating an organic polymeric substrate with copper and particularly is concerned with sputter or evaporation coating.

The present invention finds special applicability in the fabrication of metallized polyimide substrates useful as carriers for mounting integrated circuit chips.

BACKGROUND ART

Organic polymeric films such as polyimides are commonly employed in the semiconductor and packaging industry. Typical flexible circuit fabrication requires the use of metallized organic polymer films. Under normal process conditions, a seed or catalyst layer is sputtered or evaporated onto the polymer film. In current metallization processes, continuous treatment is required to develop uniform and reproducible film characteristics. A general process requires the preparation of the polymeric film by a series of thermal and vacuum treatments, followed by surface modification in plasmas or glow discharges, and sequential deposition of an adhesion-promoting layer chromium and copper seed layer.

The direct metallization of polyimides such as Kapton ®-H with copper had resulted in less than satisfactory adhesion at the copper-polyimide interface. In particular, problems have occurred at the copper-polyimide interface resulting in lifting up of the copper line from the underlying polyimide substrate rendering the carrier unsuitable for its intended purpose.

Accordingly, in order that the configurations which involve a copper-polyimide interface be competitive in a commercial environment, it is necessary to improve the adhesion at the copper-polyimide interface. The importance of improving the adhesion between such substrates and the metallic layers cannot be overemphasized.

SUMMARY OF INVENTION

The present invention is concerned with improving the adhesion of copper on an organic polymeric substrate such as a polyimide substrate.

In particular, according to the present invention, the adhesion between the organic polymeric layer and copper layer is enhanced by depositing the copper by sputtering or evaporation in the presence of a gas containing nitrogen and a noble gas. The amount of nitrogen in the gas is about 0.09 to about 50% by volume.

BEST AND VARIOUS MODES FOR CARRYING OUT THE INVENTION

The substrates that can be coated in accordance with the present invention are organic polymeric substrates that include synthetic polymers such as polyimides, polyimide precursors, and polyepoxides. Also, the substrates can be relatively rigid or flexible.

The polyimides used as substrates in accordance with the present invention include unmodified polyimides, as well as modified polyimides such as polyester imides, polyamide-imide-esters, polyamide-imides, polysiloxane-imides, as well as other mixed polyimides. Such are well-known in the prior art and need not be described in any great detail.

Generally, the polyimides include the following recurring unit:

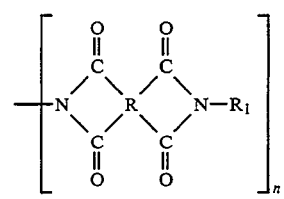

where n is an integer representing the number of repeating units to provide a molecular weight usually about 10,000 to about 100,000. R is at least one tetravalent organic radical selected from the group consisting of:

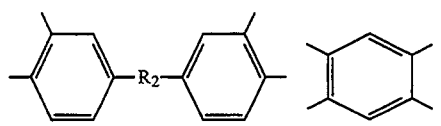

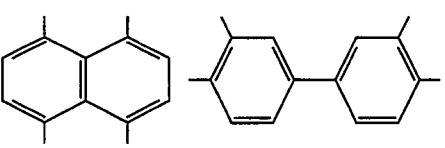

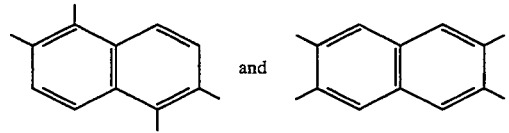

and $R_2$ being selected from the group consisting of divalent aliphatic hydrocarbon radicals having from 1 to 4 carbon atoms and carbonyl, oxy, sulfo, hexafluoroisopropylidene and sulfonyl radicals and in which $R^1$ is at least one divalent radical selected from the group consisting of:

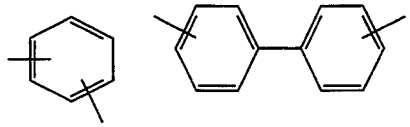

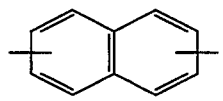

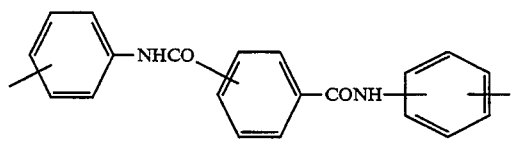

and

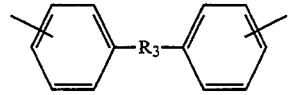

in which $R^3$ is a divalent organic radical selected from the group consisting of $R_2$, silicon, and amino radicals. Polymers containing two or more of the R and/or $R_1$ radicals, especially multiple series of $R_1$ containing amido radicals, can be used.

Commercially available polyimide precursors (polyamic acid), for example various polyimide precursors from DuPont are available under the trade designation Pyralin. These polyimide precursors come in many grades, including Pyralin polyimide precursors available from DuPont under the further trade designations PI-2555, PI2545, PI-2560, PI-5878, PIH-61454, and PI-2540. Some of these are Pyromellitic Dianhydride-Oxydianiline (PMDA-ODA) polyimide precursors.

Commercially available chemically cured polyimides, for example various polyimides from DuPont are available under the trade designation Kapton, including H-Kapton, V-Kapton, HN-Kapton, and VN-Kapton, which are all chemically cured polyimides. The chemically cured polyimides are generally cured with an anhydride curing agent such as acetic anhydride.

In order to achieve the significantly improved adhesion obtained by the present invention, it is necessary that the copper be deposited by sputtering or evaporation in the presence of nitrogen gas.

The gas employed includes nitrogen and a noble gas such as argon, xenon and krypton and preferably argon. The nitrogen content in the gas is typically about 0.09% to about 50% by volume, preferably about 1% to about 20% of volume and most preferably about 5% about 12% by volume.

The sputtering or evaporation is carried out in a vacuum chamber and preferably in the presence of a magnetic field to maintain the plasma. Sputter and evaporation apparatus suitable to employ are well-known and need not be discussed in any detail herein.

For instance, see Microelectronic Manufacturing and Testing, Selection Guide: Sputtering Equipment, November 1987, pp. 1 and 19-22. In general, according to the present invention, sputtering is conducted in a vacuum environment with noble gas ions such as argon and nitrogen being accelerated by an electric field. The resulting high-speed positive ions are then impacted on a suitable cathode target which, in the case of the present invention, is copper. Due to the kinetic energy of the positive ions, atoms or molecules are blasted from the surface of the target material. These sputtered particles are then deposited on the desired substrate portion in the apparatus.

There are generally three basic types of sputtering techniques. In the diode mode, the target material is attached to a cathode and the substrate upon which a sputtered film is to be deposited is placed on the anode. The triode mode is similar to the diode mode, except that it also includes a hot filament. This filament generates a high-density plasma that is independent of the excitation of the target. In the magnetron mode, which is preferred pursuant to the present invention, a magnetic field is used to increase the distance which the electrons travel.

The coating of copper carried out pursuant to the present invention is preferably performed using magnetron sputtering at voltages of about 300-700 volts D.C. and pressures of about $8 \times 10^{-4}$ to about $3 \times 10^{-3}$ torr. Also, it is preferred according to the present invention, that the polymeric substrate during the sputtering or evaporation be at temperatures of less than about 60° C., since at temperatures above about 60° C. dimensional changes tend to occur to an undesirable extent. This in turn could render the material unreliable. The sputtering is preferably carried out in the presence of a magnetic field of about 0 to about 400 gauss. The rate of deposition of the copper is typically about 50 to 150 angstroms/second, an example of which being about 90 angstroms/second.

It is believed that the presence of the nitrogen in the gas results in the formation of nitride in the copper layer.

The copper layer deposited is preferably about 150 to about 1000 angstroms thick and most preferably about 1000 angstroms. The thickness of the copper layer is preferably not above about 1000 angstroms. The nitrogen content in the copper layer also increases the electrical resistivity of the layer and increases stress characteristics. At too high a level these are undesirable when the coated substrates are to be used in the electronics industry.

In a typical arrangement, a further layer of copper is sputter deposited onto the layer provided by the present invention to obtain an additional copper thickness of about 3000 to 6000 angstroms, followed by plating a further layer of copper to provide a total copper thickness of about 0.3 mil to about 3 mils. This further layer of copper can be deposited by well known electroplating technologies such as from an acid copper bath.

The improvement in adhesion pursuant to the present invention makes it possible to directly deposit copper onto the polymeric substrate without the use of an intermediate layer of an adhesion promoter such as chromium, and still achieve an acceptable level of adhesiveness.

The present invention does not require the deposition of a chromium layer for achieving adhesion of the copper to the polymeric substrate. The ability to eliminate chromium not only reduces the overall expense and complexity of the process, but is also advantageous from an environmental viewpoint. For instance, it reduces the needed processing for the effluent streams resulting from the chrome etching.

In addition, the present invention makes it possible to deposit on a polymeric substrate that has not been subjected to any plasma pretreatment as is typically carried out in the prior art.

The following non-limiting examples are presented to further illustrate the present invention:

EXAMPLE I

To a free-standing polyimide film (Kapton-H) is sputter deposited about 1000 angstroms of copper on each side of the polyimide, using the magnetron mode with D.C. excitation at a rate of deposition of about 90 angstroms/second.

The temperature of the substrate where deposition is occurring is about 20° C.±5° C. The sputtering is carried out employing an argon/nitrogen gas mixture containing about 5% by volume of nitrogen. Next, an additional 6000 angstroms of copper is sputter deposited to serve as a plating seed layer. The sputtering is carried out at substrate temperatures of about 20° C.±5° C. employing argon gas. Next, copper is electroplated onto the structure using a standard acid electroplate to provide total copper thickness of about 0.3 mils.

The copper is circuitized to provide 30 mil lines using conventional photolithography. Adhesion tests are carried out by the conventional IPC-TM-650 Method 2.4.9.

Adhesion values are taken by peeling at least five lines per sample at T0, T100, and T216 hours after exposure of samples to 85° C. an 80% R.H. Adhesion measurements are indicated as rough or smooth side.

EXAMPLE 2

Example 1 is repeated except that the limited nitrogen containing copper layer deposited is about 500 angstroms thick. A second unmodified copper layer of about 6000 angstroms is sputtered on the nitrogen containing layer using an argon gas without the nitrogen gas. The adhesion results to 100 hours of exposure to 85° C. and 80% relative humidity are similar to those of Example 1.

COMPARISON EXAMPLE 3

Example 1 is repeated except that in place of the nitrogen containing copper layer a layer about 200 angstroms of chromium is sputter coated onto the polyimide which is pretreated with a plasma treatment prior to the metallization. Next an unmodified copper layer of about 6000 angstroms is sputter deposited followed by electroplating copper to provide a total copper thickness of about 0.3 mils.

As is may be concluded, all of the types of films from the above examples exhibit similar performance under the stated conditions.

What is claimed is:

1. A method for depositing copper onto an organic polymer substrate and for improving the adhesion of the copper on the organic polymeric substrate which comprises providing an organic polymer substrate; coating onto said organic polymeric substrate a layer of copper by sputtering or evaporation in the presence of a gas containing nitrogen and a noble gas, wherein the volume percentage of nitrogen in said gas is about 0.09 to about 50%.

2. The method of claim 1 wherein the copper is sputter coated onto said substrate.

3. The method of claim 2 wherein the voltage of the target during coating is about 300 to about 700 volts D.C.

4. The method of claim 2 wherein the pressure during coating is about $8 \times 10^{-4}$ to about $3 \times 10^{-3}$ torr.

5. The method of claim 1 wherein the coating of said substrate is carried out in the presence of a magnetic field.

6. The method of claim 1 wherein the noble gas is argon.

7. The method of claim 1 wherein the volume percentage of nitrogen in said gas is about 1 to about 20%.

8. The method of claim 1 wherein the volume percentage of nitrogen in said gas is about 5% to about 12%.

9. The method of claim 1 wherein the temperature of the substrate during coating is about 60° C. or less.

10. The method of claim 1 wherein the rate of deposition of said copper is about 50 to about 150 angstroms/second.

11. The method of claim 1 wherein said copper is about 150 to about 1000 angstroms thick.

12. The method of claim 1 wherein said copper is about 1000 angstroms thick.

13. The method of claim 1 wherein said substrate is a polyimide containing substrate.

14. The method of claim 1 which further includes plating an additional layer of copper onto the layer of copper coated by said sputtering or evaporation.

15. The method of claim 14 wherein said additional layer of copper is about 0.3 mil to about 3 mils thick.

16. The method of claim 1 wherein said layer of copper is coated by sputtering wherein the voltage of the target during sputtering is about 300 to about 700 volts D.C., the pressure during coating to about $8 \times 10^{-4}$ to about $3 \times 10^{-3}$ torr; said noble gas is argon; the temperature of the substrate during sputtering is about 60° C. or less, and the volume percentage of nitrogen in said gas is about 5 to about 12%.

17. The method of claim 16 wherein said substrate is a polyimide and said sputtering is carried out in the presence of a magnetic field.

18. The method of claim 17 wherein the copper layer is about 150 to about 1000 angstroms thick.

19. The method of claim 1 wherein the sputtering is carried out using a planar magnetron.

20. The method of claim 14 wherein said plating is carried out using electroplating.

21. The method of claim 17 wherein sputtering is carried out using a planar magnetron.

* * * * *